United States Patent
Lin et al.

(10) Patent No.: US 11,632,889 B2
(45) Date of Patent: Apr. 18, 2023

(54) METHOD OF FORMING MEMORY CELL

(71) Applicant: UNITED MICROELECTRONICS CORP., Hsin-Chu (TW)

(72) Inventors: Da-Jun Lin, Kaohsiung (TW); Bin-Siang Tsai, Changhua County (TW); Ya-Jyuan Hung, Kaohsiung (TW); Chin-Chia Yang, Tainan (TW); Ting-An Chien, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 30 days.

(21) Appl. No.: 17/375,021

(22) Filed: Jul. 14, 2021

(65) Prior Publication Data
US 2021/0343789 A1  Nov. 4, 2021

Related U.S. Application Data

(62) Division of application No. 16/513,719, filed on Jul. 17, 2019, now Pat. No. 11,101,324.

(30) Foreign Application Priority Data

Jun. 13, 2019  (CN) .......................... 201910510900.3

(51) Int. Cl.
*H10B 63/00*       (2023.01)
*H10K 10/50*       (2023.01)
(Continued)

(52) U.S. Cl.
CPC ............. *H10B 63/84* (2023.02); *H10K 10/50* (2023.02); *H10K 10/82* (2023.02); *H10K 19/202* (2023.02);
(Continued)

(58) Field of Classification Search
CPC ........ H10B 63/84; H10B 63/30; H10K 10/50; H10K 10/82; H10K 19/202; H10K 71/231;
(Continued)

(56) References Cited

U.S. PATENT DOCUMENTS 9,390,790 B2 * 7/2016 Bertin ................... H01L 27/285
2008/0273370 A1 11/2008 Keller
(Continued)

FOREIGN PATENT DOCUMENTS

EP  2 365 554 A2  9/2011
EP  2 365 554 A3  2/2013

*Primary Examiner* — Dao H Nguyen
(74) *Attorney, Agent, or Firm* — Winston Hsu

(57) ABSTRACT

A memory cell includes a first conductive line, a lower electrode, a carbon nano-tube (CNT) layer, a middle electrode, a resistive layer, a top electrode and a second conductive line. The first conductive line is disposed over a substrate. The lower electrode is disposed over the first conductive line. The carbon nano-tube (CNT) layer is disposed over the lower electrode. The middle electrode is disposed over the carbon nano-tube layer, thereby the lower electrode, the carbon nano-tube (CNT) layer and the middle electrode constituting a nanotube memory part. The resistive layer is disposed over the middle electrode. The top electrode is disposed over the resistive layer, thereby the middle electrode, the resistive layer and the top electrode constituting a resistive memory part. The second conductive line is disposed over the top electrode.

6 Claims, 3 Drawing Sheets

(51) Int. Cl.
  *H10K 10/82* (2023.01)
  *H10K 19/00* (2023.01)
  *H10K 71/20* (2023.01)
  *H10K 85/20* (2023.01)
  *H10N 70/20* (2023.01)
  *H10N 70/00* (2023.01)

(52) U.S. Cl.
  CPC ......... *H10K 71/231* (2023.02); *H10K 85/221* (2023.02); *H10N 70/063* (2023.02); *H10N 70/24* (2023.02); *H10N 70/826* (2023.02); *H10N 70/841* (2023.02); *H10N 70/8833* (2023.02)

(58) Field of Classification Search
  CPC .... H10K 85/221; H10N 70/063; H10N 70/24; H10N 70/826; H10N 70/8833
  USPC .............................................................. 257/4
  See application file for complete search history.

(56) References Cited

U.S. PATENT DOCUMENTS

| | | |
|---|---|---|
| 2009/0184389 A1 | 7/2009 | Bertin |
| 2009/0231910 A1 | 9/2009 | Liu |
| 2010/0108982 A1 | 5/2010 | Ping |
| 2010/0117041 A1 | 5/2010 | Hwang |
| 2011/0069525 A1* | 3/2011 | Fukumizu ........... H01L 45/1641 977/750 |
| 2011/0260290 A1 | 10/2011 | Kalra |
| 2012/0224413 A1 | 9/2012 | Zhang |
| 2012/0235112 A1 | 9/2012 | Huo |
| 2014/0160830 A1 | 6/2014 | Chung |
| 2014/0226388 A1* | 8/2014 | Khoueir ............. G11C 13/0035 365/163 |
| 2018/0197918 A1* | 7/2018 | Bertin ................. H01L 45/1675 |
| 2019/0036022 A1 | 1/2019 | Pirovano |
| 2019/0058007 A1* | 2/2019 | Tsai .................... G11C 13/004 |

\* cited by examiner

METHOD OF FORMING MEMORY CELL

CROSS REFERENCE TO RELATED APPLICATIONS

This application is a divisional application of and claims the benefit of U.S. patent application Ser. No. 16/513,719, filed Jul. 17, 2019.

BACKGROUND OF THE INVENTION

1. Field of the Invention

The present invention relates generally to a memory cell and forming method thereof, and more specifically to a memory cell integrating a nanotube memory cell and a resistive memory cell and forming method thereof.

2. Description of the Prior Art

Digital logic circuits are used in control circuits of personal computers, electronic entertainment devices, telephone exchange systems, automobiles, aircraft, and other manufacturing items. Digital logic circuits can include individual or integrated logic functions and memory functions on wafers, and it is necessary to continuously increase the integration of logic functions and memory functions as the electronic devices develop.

Memory is divided into two categories: volatile memory and non-volatile memory. In nowadays, the two important types of volatile memory are static random access memory (SRAM) and dynamic random access memory (DRAM). There are many types of non-volatile memory. Flash memory is the most popular type, and other types may include silicon-oxide-nitride-oxide-silicon (SONOS), ferroelectric random access memory (FRAM), phase-change random access memory (PRAM), magnetoresistive access memory (MRAM) and resistive random access memory (RRAM).

Nanotube random access memory (NRAM) is also presented. Carbon nanotubes are distributed on a sheet substrate, and the carbon nanotubes attract or repel each other while signal writing. Each physical state (attracting or repelling) corresponds to a circuit state. The repulsion state is an open circuit state, while the attraction state is a closed state in which a rectifying junction is formed. When power is removed from the junction, its physical state is maintained, thereby forming a non-volatile memory unit.

SUMMARY OF THE INVENTION

The present invention provides a memory cell and forming method thereof, which integrates a nanotube memory cell with a resistive memory cell, thereby doubling the memory density of one memory cell.

The present invention provides a memory cell including a first conductive line, a lower electrode, a carbon nano-tube (CNT) layer, a middle electrode, a resistive layer, a top electrode and a second conductive line. The first conductive line is disposed over a substrate. The lower electrode is disposed over the first conductive line. The carbon nano-tube (CNT) layer is disposed over the lower electrode. The middle electrode is disposed over the carbon nano-tube layer, thereby the lower electrode, the carbon nano-tube (CNT) layer and the middle electrode constituting a nanotube memory part. The resistive layer is disposed over the middle electrode. The top electrode is disposed over the resistive layer, thereby the middle electrode, the resistive layer and the top electrode constituting a resistive memory part. The second conductive line is disposed over the top electrode.

The present invention provides a method of forming memory cell including the following steps. A first conductive line is formed over a substrate. A lower electrode layer, a blanket carbon nano-tube (CNT) layer, a middle electrode layer, a blanket resistive layer and a top electrode layer are formed on the first conductive line sequentially. The top electrode layer, the blanket resistive layer, the middle electrode layer, the blanket carbon nano-tube (CNT) layer and the lower electrode layer are patterned to form a lower electrode, a carbon nano-tube (CNT) layer, a middle electrode, a resistive layer and a top electrode stacked from bottom to top, thereby the lower electrode, the carbon nano-tube (CNT) layer and the middle electrode constituting a nanotube memory part, and the middle electrode, the resistive layer and the top electrode constituting a resistive memory part.

According to the above, the present invention provides a memory cell and forming method thereof, which forms a first conductive line on a substrate; a lower electrode on the first conductive line; a carbon nano-tube (CNT) layer on the lower electrode; a middle electrode on the carbon nano-tube (CNT) layer; a resistive layer on the middle electrode; a top electrode on the resistive layer; and, a second conductive line on the top electrode. Thereby, the lower electrode, the carbon nano-tube (CNT) layer and the middle electrode constitute a nanotube memory part, and the middle electrode, the resistive layer and the top electrode constitute a resistive memory part. This integrates a nanotube memory cell with a resistive memory cell, and thus forms a twin-bit memory cell, and doubles the memory density of one memory cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
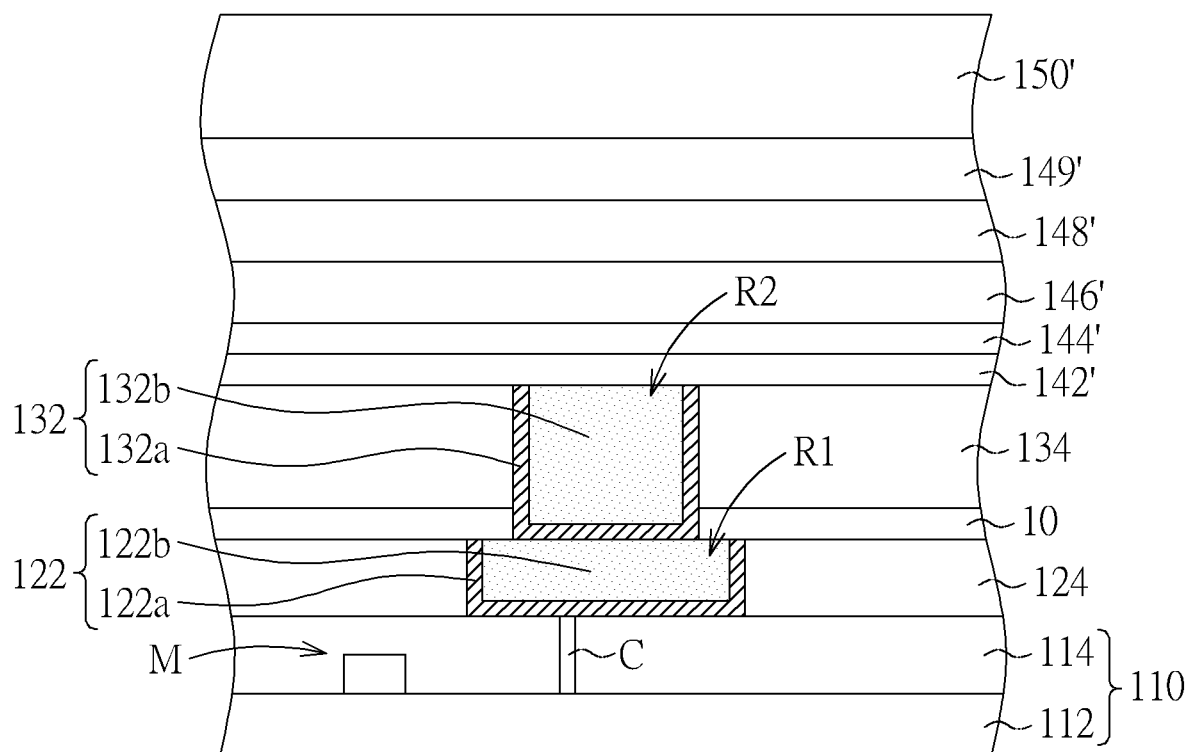
FIG. 1 schematically depicts a cross-sectional view of a method of forming memory cell according to an embodiment of the present invention.

FIGS. 1-6 schematically depict cross-sectional views of a method of forming memory cell according to an embodiment of the present invention. As shown in FIG. 1, a substrate 110 is provided. The substrate 110 may include a bottom substrate 112, a transistor M, a contact plug C and an interlayer dielectric layer 114, wherein the transistor M is on the bottom substrate 112, and the transistor M and the contact plug C electrically connected to the transistor M are formed in the interlayer dielectric layer 114 on the bottom substrate 112, but it is not limited thereto. The bottom substrate 112 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers; the transistor M may be a transistor having a polysilicon gate or a transistor having a metal gate etc; the interlayer dielectric layer 114 may be an oxide layer; the contact plug C may be composed of copper, tungsten or etc, and the contact plug C may formed by forming a recess in the interlayer dielectric layer 114 and then filling the contact plug C into the recess, but it is not limited thereto.

A conductive line 122 is formed on the substrate 110. The conductive line 122 may include a barrier layer 122*a* and a metal 122*b*, wherein the barrier layer 122*a* surrounds the metal 122*b*. The barrier layer 122*a* may be constituted by titanium nitride or/and tantalum nitride, and the metal 122*b* may be constituted by copper or tungsten, but it is not limited thereto. More precisely, a dielectric layer (not shown) may be formed and then patterned (or etched) to form a dielectric layer 124 on the substrate 110, wherein the dielectric layer 124 has a recess R1, and the conductive line 122 is formed in the recess R1. The dielectric layer 124 may be a dielectric layer with an ultra-low dielectric constant, but it is not restricted thereto.

A first conductive line 132 is formed on the conductive line 122. In this embodiment, the first conductive line 132 includes a metal line, and the first conductive line 132 may include a barrier layer 132*a* and a metal 132*b*, wherein the barrier layer 132*a* surrounds the metal 132*b*, but it is not limited thereto. The barrier layer 132*a* may be constituted by titanium nitride or/and tantalum nitride, and the metal 132*b* may be constituted by copper or tungsten, but it is not limited thereto. More precisely, a selective cap layer (not shown) and a first dielectric layer (not shown) may be sequentially formed on the conductive line 122 and the dielectric layer 124, therefore a cap layer 10 and a first dielectric layer 134 being formed on the conductive line 122 and the dielectric layer 124, wherein the cap layer 10 and the first dielectric layer 134 have a recess R2, and then the first conductive line 132 is formed in the recess R2. A barrier layer (not shown) and a metal (not shown) may sequentially fill into the recess R2 to form the first conductive line 132 in the recess R2. The cap layer 10 may be a nitrogen doped carbon silicon layer, and the first dielectric layer 134 may be a plasma enhanced oxide (PEOX) layer, but it is not restricted thereto.

A lower electrode layer 142', a blanket carbon nano-tube (CNT) layer 144', a middle electrode layer 146', a blanket resistive layer 148' and a top electrode layer 149' may be sequentially formed on the first conductive line 132 and the first dielectric layer 134 from bottom to top. In this embodiment, the lower electrode layer 142', the middle electrode layer 146' and the top electrode layer 149' may be titanium nitride layers; the blanket carbon nano-tube (CNT) layer 144' may be stacked material layers, and these material layers have different conductive properties; the blanket resistive layer 148' may be a stacked resistive layer, but it is not limited thereto. Preferably, the blanket resistive layer 148' may include a tantalum oxide ($TaO_x$) layer and a tantalum oxide ($Ta_2O_5$) layer stacked from bottom to top, wherein the tantalum oxide ($TaO_x$) layer serves as a buffer layer. Then, a mask layer 150' may cover the top electrode layer 149' blanketly, wherein the mask layer 150' may be a nitride layer, but it is not limited thereto.

Figure 2:
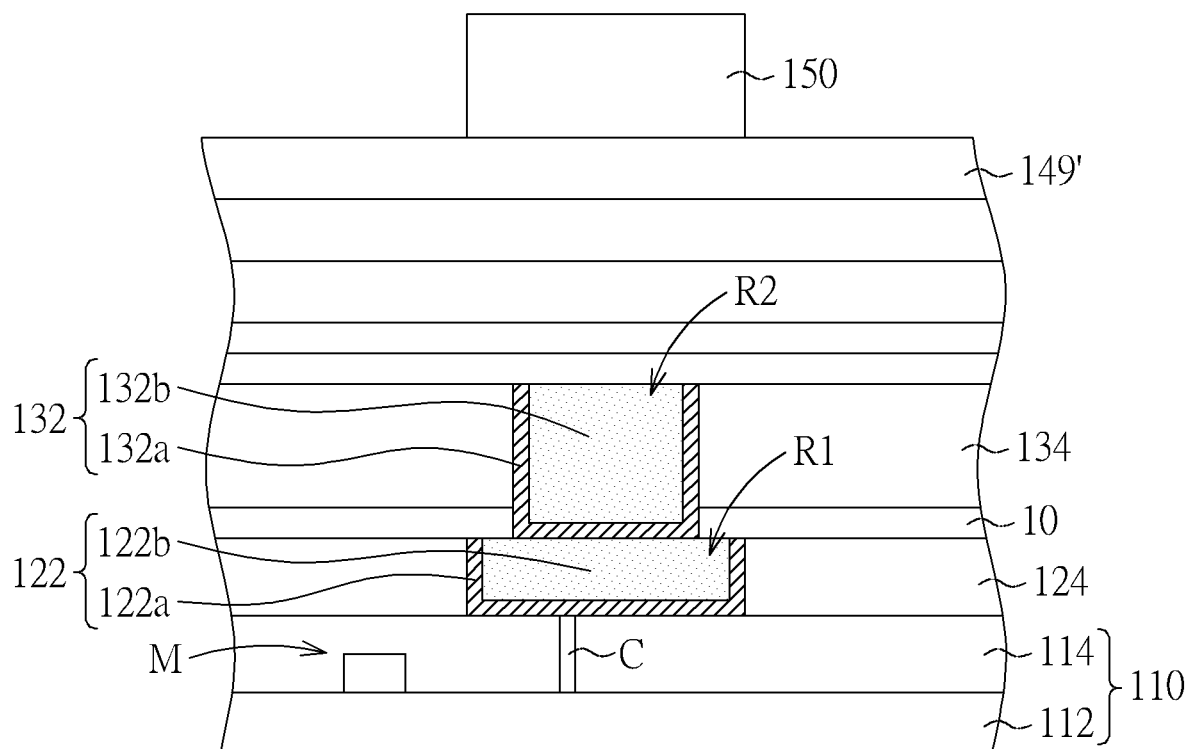
FIG. 2 schematically depicts a cross-sectional view of a method of forming memory cell according to an embodiment of the present invention.
Figure 3:
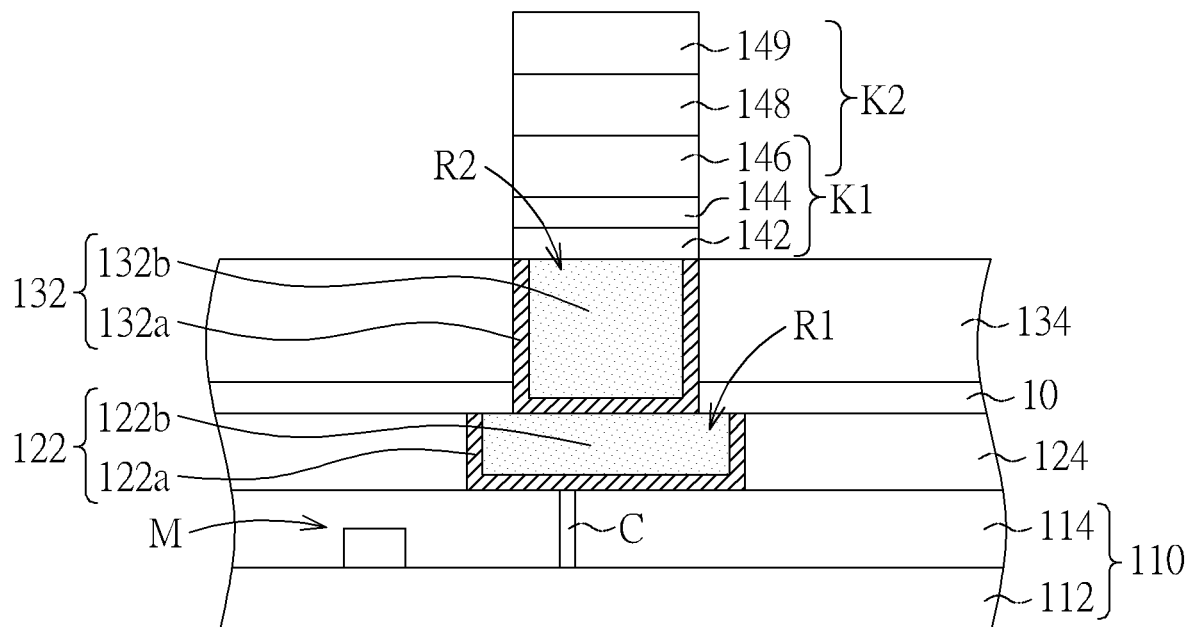
FIG. 3 schematically depicts a cross-sectional view of a method of forming memory cell according to an embodiment of the present invention.

Please refer to FIGS. 2-3, the top electrode layer 149', the blanket resistive layer 148', the middle electrode layer 146', the blanket carbon nano-tube (CNT) layer 144' and the lower electrode layer 142' may be patterned to form a lower electrode 142, a carbon nano-tube (CNT) layer 144, a middle electrode 146, a resistive layer 148 and a top electrode 149 stacked from bottom to top, thereby the lower electrode 142, the carbon nano-tube (CNT) layer 144 and the middle electrode 146 constituting a nanotube memory part K1, and the middle electrode 146, the resistive layer 148 and the top electrode 149 constituting a resistive memory part K2.

More precisely, as shown in FIG. 2, the mask layer 150' is patterned to form a mask layer 150 on the top electrode layer 149' and expose an area would be removed. As shown in FIG. 3, the top electrode layer 149', the blanket resistive layer 148', the middle electrode layer 146', the blanket carbon nano-tube (CNT) layer 144' and the lower electrode layer 142' may be patterned to form the lower electrode 142, the carbon nano-tube (CNT) layer 144, the middle electrode 146, the resistive layer 148 and the top electrode 149 stacked from bottom to top. The lower electrode 142 directly contacts and is electrically connected to the first conductive line 132. These stacked material layers constitute the nanotube memory part K1 and the resistive memory part K2, and the nanotube memory part K1 and the resistive memory part K2 share the middle electrode 146, thereby a twin-bit memory cell being formed by adjusting different voltage sections, wherein the twin-bit memory cell is a bipolar component. As a positive voltage of 2 volts is applied, the nanotube memory part K1 and the resistive memory part K2 turn on, called (1, 1) state. As a positive voltage of 1 volt is applied, only the nanotube memory part K1 turns on, called (0, 1) state. As a negative voltage of 1 volt is applied, only the resistive memory part K2 turns on, called (1, 0) state. As a negative voltage of 3 volts is applied, the nanotube memory part K1 and the resistive memory part K2 turn off, called (0, 0) state. Thus, the memory cell of the present invention has double memory density, smaller volume and low processing costs.

Figure 4:
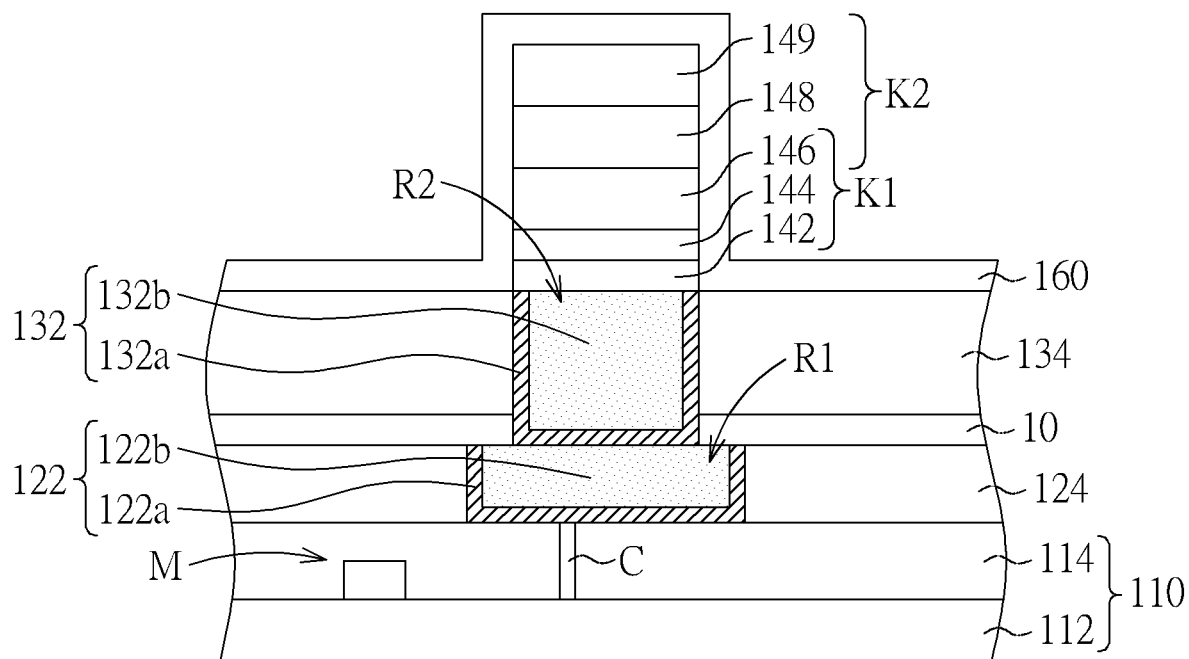
FIG. 4 schematically depicts a cross-sectional view of a method of forming memory cell according to an embodiment of the present invention.

As shown in FIG. 4, a cap layer 160 conformally covers a top surface of the first dielectric layer 134, a top surface of the top electrode 149, and sidewalls of the lower electrode 142, the carbon nano-tube (CNT) layer 144, the middle electrode 146, the resistive layer 148 and the top electrode 149. The cap layer 160 may be a nitride layer or a carbon containing nitride layer, but it is not limited thereto.

Figure 5:
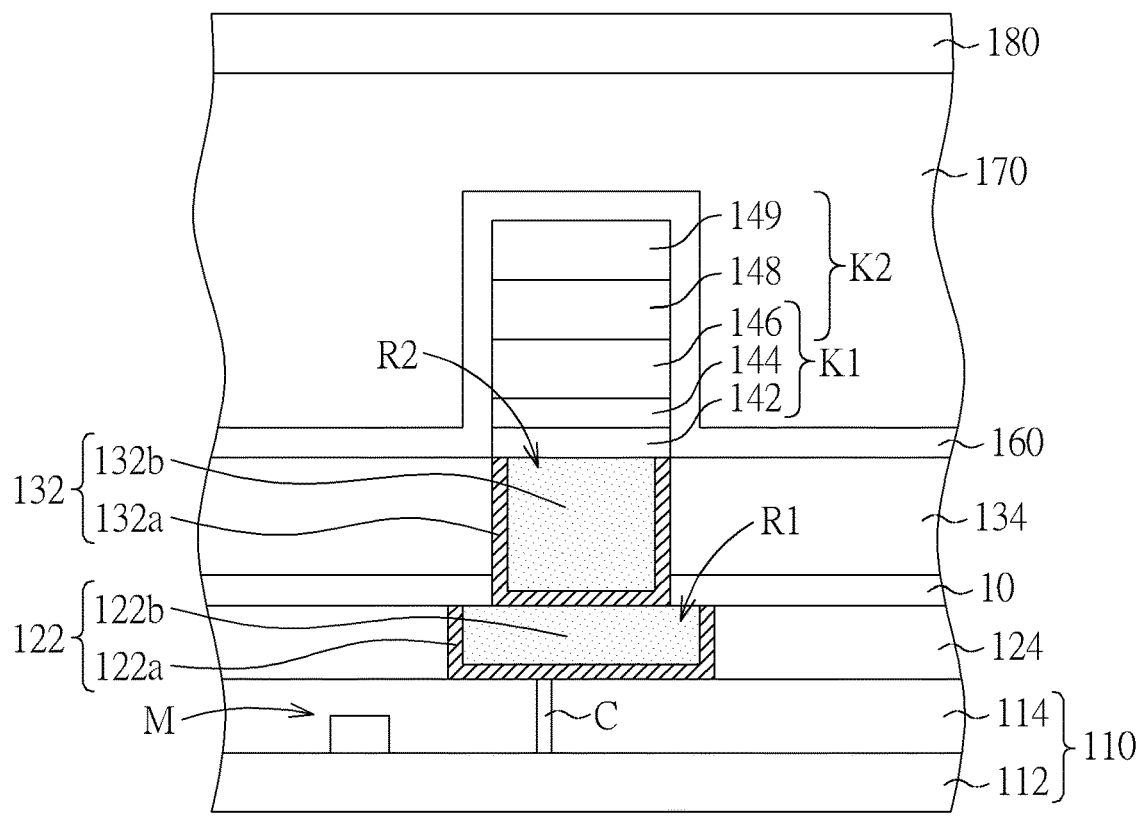
FIG. 5 schematically depicts a cross-sectional view of a method of forming memory cell according to an embodiment of the present invention.

As shown in FIG. 5, a second dielectric layer 170 is deposited to cover the first dielectric layer 134, the lower electrode 142, the carbon nano-tube (CNT) layer 144, the middle electrode 146, the resistive layer 148 and the top electrode 149 blanketly. A mask layer 180 may be selectively formed on the second dielectric layer 170. The mask layer 180 may be a SaC and $CAPO_x$ layer, but it is not restricted thereto.

Figure 6:
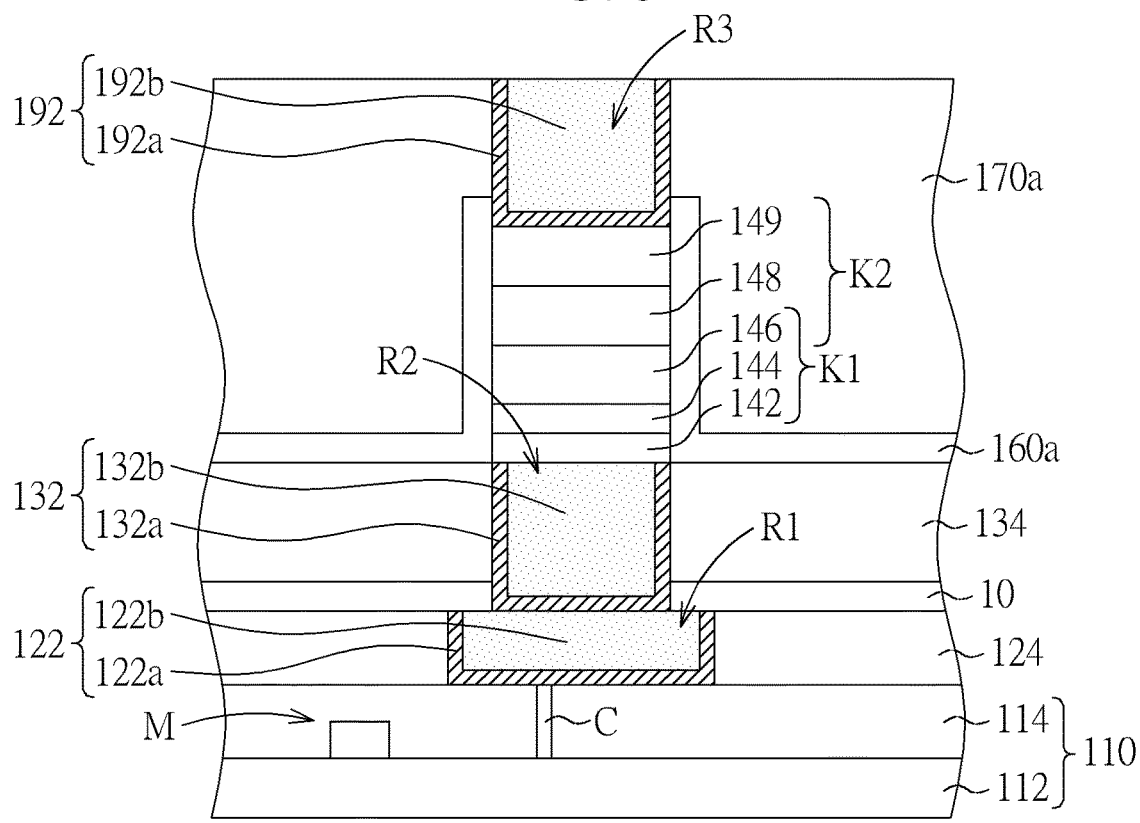
FIG. 6 schematically depicts a cross-sectional view of a method of forming memory cell according to an embodiment of the present invention.

After the second dielectric layer 170 or the mask layer 180 is formed, the second dielectric layer 170 and the mask layer 180 are etched to form a recess R3 in a cap layer 160*a* and a second dielectric layer 170*a* and expose the top electrode 149, as shown in FIG. 6. A second conductive line 192 is formed in the recess R3 and directly on the top electrode 149. Thereafter, the second conductive line 192 and the mask layer 180 exceeding from the recess R3 are removed.

In this case, the second conductive line 192 may include a metal line, and the second conductive line 192 may include a barrier layer 192a and a metal 192b, wherein the barrier layer 192a surrounds the metal 192b, but it is not limited thereto. The barrier layer 192a may be constituted by titanium nitride or/and tantalum nitride, and the metal 192b may be constituted by copper or tungsten, but it is not limited thereto.

To summarize, the present invention provides a memory cell and forming method thereof, which forms a first conductive line on a substrate; a lower electrode on the first conductive line; a carbon nano-tube (CNT) layer on the lower electrode; a middle electrode on the carbon nano-tube (CNT) layer; a resistive layer on the middle electrode; a top electrode on the resistive layer; and, a second conductive line on the top electrode. Thereby, the lower electrode, the carbon nano-tube (CNT) layer and the middle electrode constitute a nanotube memory part, and the middle electrode, the resistive layer, and the top electrode constitute a resistive memory part. Therefore, a twin-bit memory cell constituted by integrating a nanotube memory cell with a resistive memory cell is formed, wherein the twin-bit memory cell is a bipolar component. This doubles the memory density, shrinks the volume and reduces the processing costs of one memory cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming memory cell, comprising:
   forming a first conductive line over a substrate;
   forming a lower electrode layer, a blanket carbon nano-tube (CNT) layer, a middle electrode layer, a blanket resistive layer and a top electrode layer on the first conductive line sequentially; and
   patterning the top electrode layer, the blanket resistive layer, the middle electrode layer, the blanket carbon nano-tube (CNT) layer and the lower electrode layer to form a lower electrode, a carbon nano-tube (CNT) layer, a middle electrode, a resistive layer and a top electrode stacked from bottom to top, thereby the lower electrode, the carbon nano-tube (CNT) layer and the middle electrode constituting a nanotube memory part, and the middle electrode, the resistive layer and the top electrode constituting a resistive memory part, wherein the resistive layer comprises a stacked resistive layer, and wherein the stacked resistive layer comprises a tantalum oxide ($TaO_x$) layer and a tantalum oxide ($Ta_2O_5$) layer stacked from bottom to top.

2. The method of forming memory cell according to claim 1, further comprising:
   forming a first dielectric layer having a recess on the substrate; and
   forming the first conductive line in the recess.

3. The method of forming memory cell according to claim 2, further comprising:
   forming a cap layer conformally on the first dielectric layer, and covering sidewalls of the lower electrode, the carbon nano-tube (CNT) layer, the middle electrode, the resistive layer and the top electrode after the lower electrode, the carbon nano-tube (CNT) layer, the middle electrode, the resistive layer and the top electrode stacked from bottom to top are formed.

4. The method of forming memory cell according to claim 2, further comprising:
   depositing a second dielectric layer covering the first dielectric layer, the lower electrode, the carbon nano-tube (CNT) layer, the middle electrode, the resistive layer and the top electrode blanketly after the lower electrode, the carbon nano-tube (CNT) layer, the middle electrode, the resistive layer and the top electrode stacked from bottom to top are formed.

5. The method of forming memory cell according to claim 4, further comprising:
   etching the second dielectric layer to form a recess and expose the top electrode after the second dielectric layer is formed; and
   forming a second conductive line in the recess and directly on the top electrode.

6. The method of forming memory cell according to claim 1, wherein the carbon nano-tube (CNT) layer comprises stacked material layers.

* * * * *